United States Patent [19]

George et al.

[11] 4,058,799
[45] Nov. 15, 1977

[54] BLOCK ORIENTED RANDOM ACCESS BUBBLE MEMORY

[75] Inventors: Peter K. George; Thomas R. Oeffinger, both of Placentia, Calif.

[73] Assignee: Rockwell International Corporation, El Segundo, Calif.

[21] Appl. No.: 578,975

[22] Filed: May 19, 1975

[51] Int. Cl.² .................................... G11C 19/08
[52] U.S. Cl. ...................... 340/174 TF; 365/16; 365/2; 365/4; 365/11
[58] Field of Search ........................... 340/174 TF

[56] References Cited

U.S. PATENT DOCUMENTS

| | | | |
|---|---|---|---|
| 3,810,133 | 5/1974 | Bobeck et al. | 340/174 TF |
| 3,838,407 | 9/1974 | Juliussen | 340/174 TF |
| 3,879,585 | 4/1975 | Bobeck et al. | 340/174 TF |

Primary Examiner—James W. Moffitt
Attorney, Agent, or Firm—L. Lee Humphries; H. Fredrick Hamann; G. Donald Weber, Jr.

[57] ABSTRACT

A block oriented random access memory (BORAM) magnetic bubble domain system which provides increased throughput of information and reduced access or read time for the same information as compared to existing major-minor or decoder accessed chip organizations which it is designed to replace.

20 Claims, 3 Drawing Figures

BLOCK ORIENTED RANDOM ACCESS BUBBLE MEMORY

The invention described herein was made in the course of or under a contract or subcontract thereunder, with the department of the Army.

BACKGROUND

1. Field of the Invention

This invention relates to magnetic bubble domain device chip organizations and in particular to those in which a large block of data is randomly accessed.

2. Prior Art

In the area of magnetic bubble domain devices, many organizational systems are known. One type of chip organization is the so-called major-minor loop organization. In this type of organization, a plurality of minor loops are used to store information. These minor loops are arranged adjacent to a major loop through which general control operations and functions are achieved. These types of organizations are also used in so-called block organized random access memories (BORAM). However, some of the existing designs suffer from several undesirable features. For example, the access time to a particular block in the existing designs is frequently quite long. Typically, this time can be as long as the time required for the information to transverse the entire minor loop plus the portion of the major loop from the minor loop to the detector. In addition, readout of the information from the existing designs involves transferring information back into the minor loop before processing can continue which results in increased block readout time. The latter problem could possibly be eliminated by replicating out of the minor loops. However, a replicator of the type required with wide operating margins does not, as yet, exist.

Another approach to major-minor loop organization requires separate in-feed and out-feed paths between each minor loop and the major loop. This arrangement increases access time and chip area utilization.

Some of the known proposals to alleviate these problems require extensive utilization of area of the chip. Other proposed solutions require bubble domain components such as decoders which have not yet been realized with wide operating margins.

SUMMARY OF THE INVENTION

This invention relates to chip organization for use in BORAM systems in place of major-minor loop chips. In particular, a plurality of storage loops are arranged in suitable fashion. A subsidiary path is provided around a portion of each storage loop. This subsidiary path is arranged to be of substantially the same length as the loop portion which it parallels. Consequently, bubble domains may traverse either of these paths, selectively, within the same time duration.

A switching mechanism is provided to determine which of the paths the information in the storage loop follows. A propagation path is arranged between the subsidiary path and a detector so that information can be transferred from the storage loop to a detector via a portion of the subsidiary path and the transfer path.

A generator and a replicator/annihilator are arranged adjacent to the subsidiary path so that bubble domains may be selectively supplied to or deleted from the information stored in the storage loop.

Suitable control elements are arranged to control the generation of bubble domains, the replication or annihilation of bubble domains, the detection of bubble domains and the selective transfer of bubble domains from the storage loop to the detector path.

DESCRIPTION OF THE PREFERRED EMBODIMENT

Figure 1:
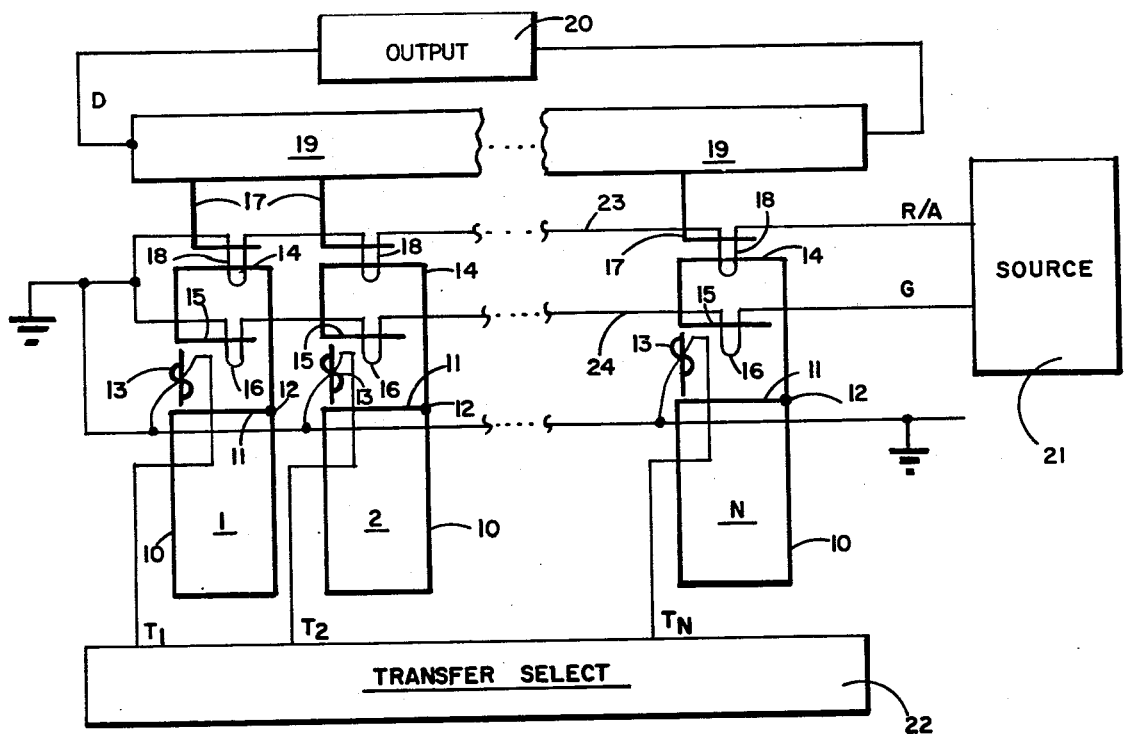
FIG. 1 is a schematic representation of a block organized random access memory in accordance with the instant invention.

Throughout the following description as well as in the accompanying drawings, similar components bear similar reference numerals.

Referring now to FIG. 1, there is shown a schematic diagram or representation of a bubble domain random access memory (BORAM) chip which utilizes the subject invention. In this arrangement, a plurality N of storage loops of a type known in the art are utilized. The invention is not limited to any particular number of loops. For example, a single loop is equally as operable as a relatively large plurality of loops. The only limitation on the implementation is the required size of the system or the area of the chip. Each of the N storage loops is labelled 10 on FIG. 1. Closed loop 10 represents a propagation path which is closed on itself and may incorporate any suitable or desirable bubble domain propagation pattern. For example, loop 10 may be comprised of chevron-shaped elements, T-bars, X-bars or the like or any combination thereof. The particular elemental structure of each loop 10 forms no portion of the invention, per se.

One portion of storage loop 10 is represented by path 11. This path is, in the illustrative representation, shown as a horizontal portion of the loop. The elemental structure of the portion 11 of loop 10 is, typically, the same as the elemental structure of the remainder of loop 10. Again, this particular elemental structure forms no portion of the invention, per se. Rather, portion 11 is defined as that portion of the propagation loop 10 located between merge 12 and switch 13.

Merge 12 is any suitable bubble domain device structure or configuration, many of which are known in the art. This structure permits the merging of loop 10, path portion 11 and subsidiary path 14 as will be described hereinafter. Thus, bubble domains can propagate along path 11 or path 14 into loop 10 at merge 12 without any special switching devices. Switch 13 may be any suitable two way transfer switch. A typical example is the so-called dollar sign ($) switch 13 which is known in the art. Of course, separate input and output paths or switches can be utilized if desired for technical reasons. As will become more readily apparent, subsidiary path 14 extends between switch 13 and merge 12. The actual propagation length of path portion 11 and subsidiary path 14 are defined to be substantially identical. Consequently, while the path configurations may be similar or not, the device configuration is arranged so that the time of propagation of information along path 11 or path 14 from switch 13 to merge 12 is substantially identical.

Path 15 is a suitable path of any desirable elemental construction. Propagation path 15 extends from generator 16 to switch 13. Generator 16 may be any suitable generator device configuration. A loop generator of known configuration is illustrated.

An additional propagation path 17 is arranged between replicate/annihilate device 18 and detector stretcher 19. Replicate/annihilate device 18 can be of any conventional design. A known loop structure is illustrated. When appropriate, in accordance with control signals described hereinafter, information is transferred along propagation path 17 to a typical detector element 19 such as a stretcher detector described in the copending application of John L. Archer et al, entitled Magnetic Bubble Domain Detection Device, bearing Ser. No. 290,607, now abandoned and assigned to the common assignee. Of course, a zig-zag detector structure or the like can be utilized as well. The detector structure 19 is connected to a suitable detector electronics arrangement 20 which consists of appropriate clamping and strobing circuitry as well as the associated logic circuits.

A suitable source 21 which supplies appropriate signals is arranged to supply the replicate/annihilate signal (R/A) along line 23 to a suitable reference source, for example ground. Typically, in a preferred embodiment, the signal R/A is a bipolar (i.e. positive and negative going) signal which is applied to the replicate/annihilate device 18. In one condition, the R/A signal causes replication. In the other condition, the R/A signal causes annihilation. In the alternative, separate lines may be provided for separate replicate (R) and annihilate (A) signals.

Additionally, source 21 (or a separate source) supplies the generate (G) signal along line 24 to generators 16. This signal may be a positive (or negative) going signal which is connected to suitable reference potential, for example ground. Of course, the polarities of all signals including R/A and G are a function of the frequency and direction of the applied fields.

A transfer select source 22 is arranged to supply signals T1-TN, in parallel, to the transfer switches 13 in the respective storage loops 10. Again, the signals T1-TN may be positive (or negative) going signals which are directed to a suitable reference potential, for example ground.

In operation, it is considered that the initial condition is such that no information is stored in any of the individual storage loops 10. Consequently, it is assumed that initial operation will be to store information in the loops. Thus, it is assumed that the BORAM shown in FIG. 1 is placed in a suitable magnetic field environment which generally includes a bias field which is perpendicular to the plane of the Figure and a rotational field which is rotating in the plane of the Figure. These fields enable the system to selectively nucleate and move bubble domains in the overall structure. A detailed analysis of the operation of a magnetic bubble domain structure is deemed unnecessary in this description inasmuch as this operation is well known in the art.

Nevertheless, it is understood that the fields are applied wherein the system is ready to be operated. The signal G is periodically applied to generator 16 to generate a bubble in the associated propagation path 15. Inasmuch as each of the generators 16 for each of the N loops is pulsed concurrently via line 24, a bubble domain is generated in each of the propagation paths 15 for each pulse signal G.

In response to the operation of the bias and rotational fields, the bubble domain produced at generator 16 propagates along path 15 toward switch 13. Assuming now that no transfer signal T1-TN is supplied by transfer/select source 22 to a particular transfer switch 13, the bubble domains continue to propagate along path 15 onto path 14. The bubble domains continue to propagate along path 14 under the influence of the magnetic fields until they arrive at the replicate/annihilate device 18. The R/A signals are also periodic pulse signals which, in this mode, operate to annihilate the bubble domains on path 14. Consequently, no bubble domains propagate along path 14 and through merge 12 into loop 10.

Conversely, if a transfer signal T1-TN is applied to any one of the transfer switches 13 by source 22, the bubble domain which has previously been generated and propagated along path 15 is transferred via switch 13 to path portion 11 of loop 10. The bubble domain continues to propagate along portion 11 through merge 12 into the major portion of loop 10. The bubble domain continues to propagate around loop 10 under the influence of the applied magnetic fields. In this manner, information can be stored in all of the loops individually. That is, by selectively activating respective switches 13, individual loops 10 are filled with data. Conversely, through a suitable multiplexing arrangement (not shown) all of the transfer switches 13 can be pulsed simultaneously wherein a bubble generated at generator 16 and propagating along path 15 is stored and transferred into the respective loop. Consequently, parallel input can be achieved. Of course, in this arrangement, the generators will be individually controlled.

An alternative operation can be utilized for storing information in loops 10. That is, the information can be generated by generator 16, propagated along path 15 through to path 14. The information can then be selectively annihilated or not by the replicate/annihilate structure 18 by the application of the appropriate R/A signal. Thus, if information is annihilated, an effective zero propagates along path 14 through merge 12 to loop 10. Of course, if it is not annihilated, a bubble domain (which may represent a binary one) is propagated along path 14 through merge 12 into loop 10.

In this arrangement, however, separate sources of the R/A signals for the replicate/annihilate devices 18 are required. The requirement of these separate drivers or sources includes the requirement for separate conductors to the appropriate pins or leads for the chip. Consequently, in situations wherein geometrical size (i.e. area) of the chip is important, the first mentioned operation permits a smaller chip configuration. The choice of separate R/A lines or separate T lines (or both) determines the operational approach to be utilized.

In a typical embodiment and utilization of the system, the entire storage operation can be terminated when the respective storage loops or memory are full. Typically, the information locations are filled up to the location adjacent to transfer switch 13. While other storage loops are being filled, the information in any individual storage loop recirculates therein under the influence of the magnetic fields.

Once the respective loops have been filled with the appropriate information, the information may be selectively retrieved or read out. Read-out is effected by terminating the generator signals G and propagating the information (i.e. bubble domains) around loop 10 in a clockwise direction in the embodiment shown, and selectively energizing the appropriate transfer switch 13 by applying a transfer signal from transfer select source 22. Thus, information is transferred from loop 10 into path 14 via switch 13. In this mode of operation, replicate/annihilate device 18 is pulsed with the appropriate pulse wherein device 18 operates as a replicate switch. In other words, switch 18 operates to transmit the information on path 14 through to path 17 as well as to continue the same information along path 14. In effect, the information propagating along path 14 is retained as well as being "copied" onto propagation path 17.

As the rotational field continues to operate, the bubble domain is propagated along paths 17 and 14 concurrently. The bubble domain, as it progresses along path 14 passes through merge 12 and returns to loop 10. Likewise, as the bubble domain propagates along path 17, it passes through detector 19 whereby the information is determined. In a practical implementation, the bubble domain, after passing through detector 19, passes through a suitable guard-rail or guard-band (see FIG. 2) so that the bubble domain is not inadvertently returned to the operational area represented by FIG. 1.

Thus, it may be seen that reduced readout time can be achieved. The information in each of the storage loops 10 can be continuously rotating (dynamic storage) in response to a rotating magnetic field. In the alternative, in the absence of the rotating field, the information can be stored in a particular location with the first bit position immediately adjacent to the transfer switch 13 (static storage). The information in loop 10 can then be read out through transfer switch 13, through the short portion of path 14, through the replicate/annihilate device 18 and through path 17 directly to detector 19. The information also passes through the replicate/annihilate device 18 and is immediately returned to loop 19 via the remaining portion of path 14.

As soon as the information has been extracted from loop 10 via switch 13, the T1 transfer signal is terminated and the T2 transfer signal is initiated. Consequently, the information stored in loop 10 of storage loop 2 is immediately transmitted through the appropriate switch 13, path 14, replicate/annihilate device 18 and path 17 into detector 19. This type of operation continues through the N storage loops. Inasmuch as the dimensions of paths 14 and 17 can be minimized, the access time can be greatly reduced relative to known systems.

It is noted that in a preferred embodiment, path portions 11 and 14 are substantially identical in length wherein information may be stored in loop 10 (including path portion 11) such that a complete loop of information provides a "head-to-tail" arrangement with the first bit of information immediately adjacent the input portion of transfer switch 13 with the last bit of information in the next storage position past the transfer switch. Consequently, as information is transferred from loop 10 through loop 14 and replicated back into loop via merge 12, the heat-to-tail arrangement is retained such that no overlap or incorrect writing of information into wrong storage areas occurs. Of course, if the information stored in loop 10 does not extend into path 11, the necessity for maintaining path portions 11 and 14 substantially identical is removed.

Figure 2:
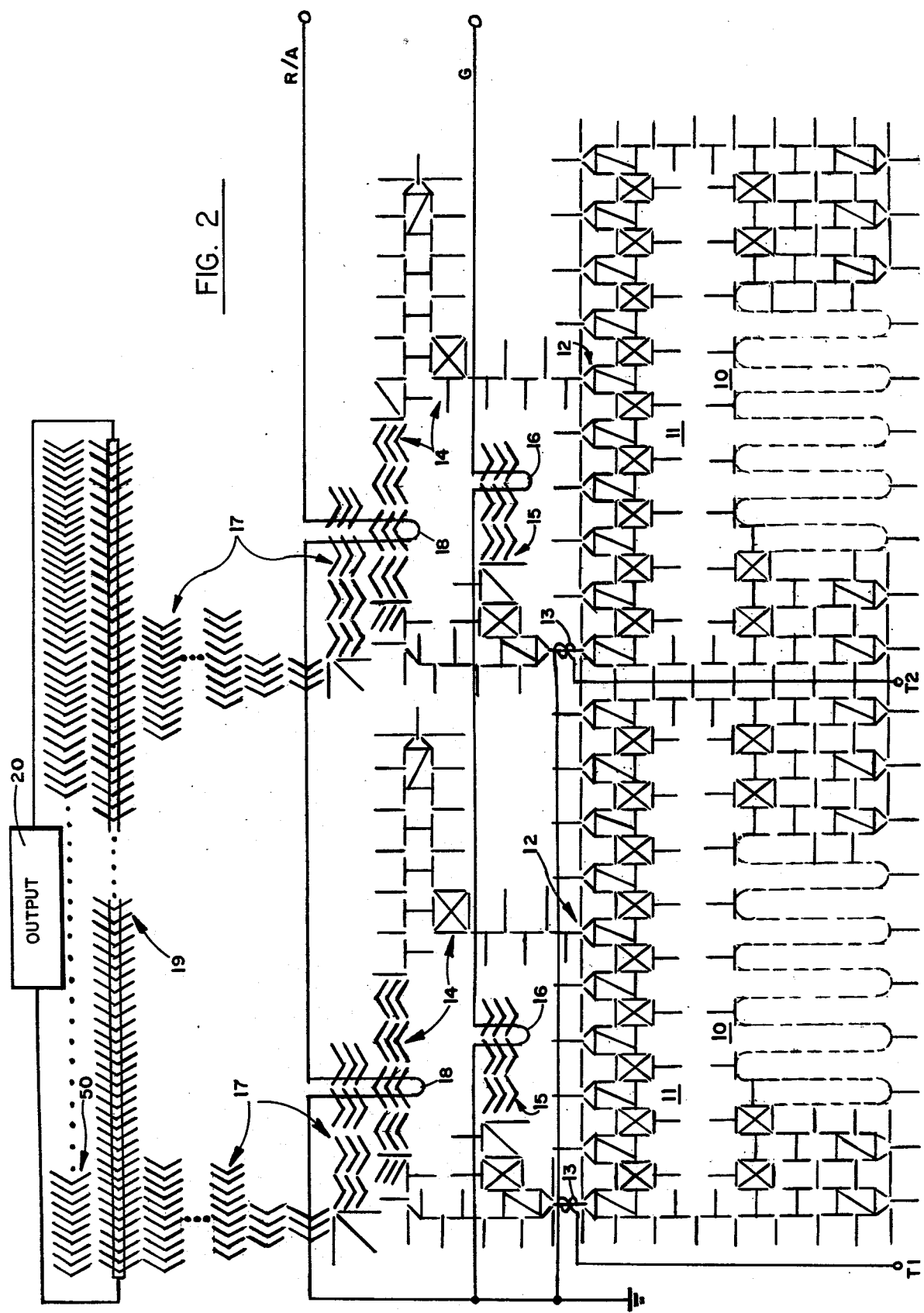
FIG. 2 is a detailed representation of the invention shown in FIG. 1 showing typical bubble domain structures arranged in a BORAM system.

Referring now to FIG. 2, there is shown a more detailed representation of one implementation of the BORAM system shown in FIG. 1. It should be understood that the representation shown in FIG. 2 is illustrative only and is not limitative. The storage loop 10 is shown in this embodiment as a continuous propagation path having many parallel paths comprising T-bar elements connected by suitable corners or transition devices such as are recited in the copending application of P. K. George, entitled Complementary Corner Structures for Magnetic Domain Propagation, bearing U.S. Ser. No. 455,177, now U.S. Pat. No. 3,924,249 and assigned to the common assignee. The length of path 10 is determined by the amount of information which is stored therein. For example, if a memory bank of 1,024 bits (a standard memory bit configuration) is desired, then loop 10 will be defined accordingly.

Path 11 comprises a plurality of corner elements including T-X corners and interconnects the two end portions of loop 10. In point of fact, path 11 may be considered to be a portion of loop 10. As noted supra, path 11 may be incorporated into loop 10 insofar as determining the length of the loop relative to the information to be stored. That is, if information is to be stored in path portion 11 as part of the storage mechanism, then loop 10 may be shortened by an amount commensurate to the length of path 11. Conversely, if path 11 is to be ignored as a storage medium, then loop 10 must be designed accordingly. While path 11 can be formed of T-bar elements, much the same as loop 10, the particular path configuration shown permits improved turn-off operation. That is, with the elemental configuration shown in FIG. 2, greater control can be maintained over the bubble domain status when the rotating field, $H_R$, in the plane of magnetic layer is turned-off. This control permits a greater degree of reliability in the data stored in the storage loops.

Path 14 is joined at one end thereof with one end of loop 10 by means of merge device 12 which is of a standard type known in the art. The other end of path 14 is disposed adjacent to the other end of loop 10 with transfer switch 13 interposed therebetween. In addition, path 15 is arranged to have one portion thereof effectively merge into path 14. In the embodiment shown, this merge is achieved substantially at the end of path 14 adjacent to switch 13. This somewhat idealized structure contemplates the utilization of path 14 and path 11 which are identical in length whereby path 11 can be used as a portion of the storage mechanism. Path 14 includes a plurality of chevronshaped elements and a plurality of T-bar elements. The chevron elements are especially useful in forming loop generator 16. Loop generator 16, such as is known in the art, is provided adjacent to path 15.

Path 17, which is shown as a substantially L-shaped configuration path, is comprised of a plurality of chevron-shaped elements. One portion of path 17 is effectively parallel to path 14. Another portion thereof is directed toward detector 19. A suitable corner or transition device 17A permits bubble domains to "turn the corner" of the L-shaped path 17. The replicate/annihilate device 18 which comprises, generally, a current loop is provided adjacent paths 14 and 17, respectively. It is noted that each of paths 14 and 17, adjacent to the replicate/annihilate switch 18, includes a plurality of substantially parallel chevron-shaped elements as a propagation path. The replicate/annihilate device comprises the aforesaid current loop disposed substantially adjacent the apices of the chevrons in path 14. The same loop is substantially adjacent to end portions of adjacent chevron structures in path 17. As known in the art, the application of the appropriate polarity current pulse causes bubble domains to be annihilated in path 14.

Conversely, another set of appropriate polarity current pulses cause bubble domains to be replicated in paths 14 and 17. That is, a bubble domain is propagated through path 14 and also, nondestructively, transferred (copied) into path 17.

The operation of the configuration shown in FIG. 2 is similar to the operation of the schematic configuration shown in FIG. 1. That is, assuming that no information is currently stored and that the appropriate bias and rotating fields are applied, the application of the generate signal G to loops 16 nucleates a bubble domain at the ends of the chevron-shaped elements in path 15. Under the influence of the rotating field, the bubble domain propagates along path 15 to switch 13. In the preferred embodiment, the bubble domain is selectively transferred (in response to a transfer signal) through switch 13 into path 11 from whence it propagates therealong into path 10. Ultimately, storage loop 10 (and perhaps path 11) is completely filled with information.

When it is desired to read information from loop 10, switch 13 is activated by the T1 signal which permits information to propagate from loop 10 through switch 13 along path 14. If the information is to be read out, the appropriate signal is supplied along the R/A line wherein replicate/annihilate device 18 causes information to be replicated from line 14 to path 17 by means of stretching and cutting the bubble domain in paths 14 and 17. Concurrently, the bubble domain in line 14 continues to propagate therealong until it again reaches path 10. Thus, the information previously stored in path 10 is read out into path 17 nondestructively and returned to path 10.

While the information is propagating along path 14 to loop 10, it is concurrently propagating along line 17 to detector 19. In the preferred embodiment, line 17 is a stretcher type line so that the bubble domain is stretched before it passes through detector 19. The bubble domain affects the resistance of magnetoresistive element of detector 19 whereby a signal is detected of apparatus 20. As the bubble domain propagates through detector 19, it continues to propagate through guard-rail 50 and is essentially expelled from the circuit area and disappears (effectively) into bubble domain material on the far side of the guard-rail.

As noted, in a preferred embodiment the paths 14 and 11 are of substantially the same length in terms of bubble propagation time therethrough. This permits the utilization of path 11 as an adjunct to loop 10. Thus, the first bit or bubble domain in the information stored in the memory is stored immediately adjacent to switch 13. The last bit or bubble domain in the information stored is located adjacent to the other side of switch 13 in line 11. As the information begins to propagate through the system, the first bit propagates from loop 10 through switch 13 along path 14. By having paths 11 and 14 substantially identical in length, there will be no overlap of the first bit of information from loop 10 onto the last bit of information stored in loop 10 (which includes path 11 in this illustration). In order to assure that paths 11 and 14 are of similar length, various path constructions or configurations can be utilized. A simple illustrative arrangement for path 11 is represented in FIG. 2 wherein a loop is added in order to extend the length thereof to be equal to the length of path 14.

It should also be noted that occasionally it is desirable to remove information from a storage loop wherein new information can be inserted. Under these conditions, the information from loop 10 passes through switch 13 which is activated by the appropriate transfer signal TN through path 14 to replicate/annihilate switch 18. In the clearing process, a signal of appropriate polarity is supplied to the replicate/annihilate switch 18 wherein all bubble domains passing under the current loop are annihilated. As soon as the information is annihilated or destroyed, storage loop 10 is clear and ready for additional information.

It should be noted that the alternative operation for inserting information into loop 10 discussed relative to FIG. 1 is also applicable to FIG. 2. However, a detailed description of this method of operation is believed unnecessary to be repeated here as the operation appears to be readily observed.

Figure 3:
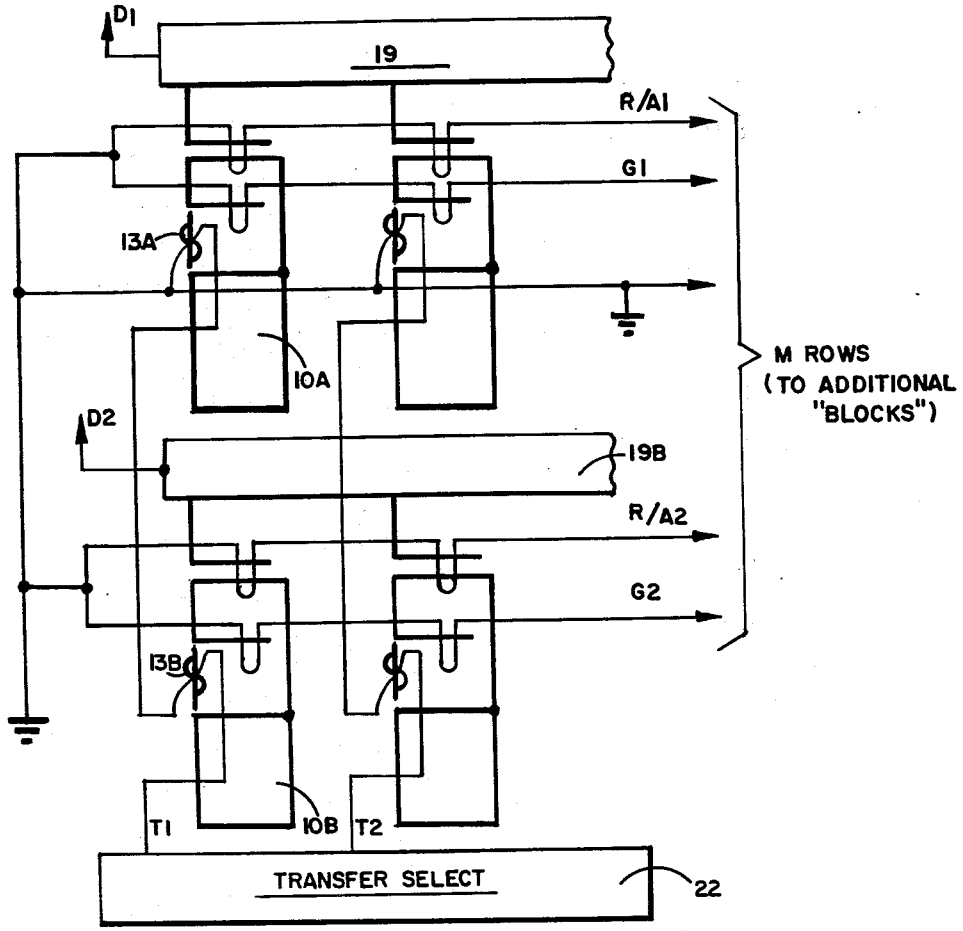
FIG. 3 is a schematic diagram of a further utilization of the subject invention.

Referring now to FIG. 3, there is shown a typical organization of a larger system. In this arrangement, a plurality of storage loops 10 are arranged both in series and in parallel. A plurality of detectors are arranged relative to the storage loops. It may be seen that by selecting the appropriate transfer select signal, a plurality of transfer functions can be initiated. In addition, information can be read out from a plurality of storage loops concurrently wherein the information is detected in separate detectors which are then arranged to produce output information in an appropriate manner.

In the circuits shown in FIGS. 1, 2 or 3, it is also understood that arrangements can be made wherein various detectors can be connected to receive information from various storage loops concurrently. By appropriate multiplexing of either the loops or the detectors or the outputs from the detectors, many parallel operations can be obtained wherein increased throughput rates are achieved.

For example, referring to FIG. 3, it is apparent that the T1 signal will energize the appropriate transfer switches 13A and 13B concurrently. Consequently, information from storage loops 10A and 10B will be transferred to detectors 19A and 19B concurrently. By appropriately multiplexing the output signals D1 and D2 from detectors 19A and 19B, respectively, a suitable output signal may be achieved. This output signal may be representative of information from two storage loops operating independently. In the alternative, loops 10A and 10B may represent portions of a particular information format whereby the signals D1 and D2 represent the total contents of the information stored. That is, it may be seen that detectors 19A and 19B may represent separate detectors or, in effect, a split detector, wherein the information stored in the respective storage loops is appropriately multiplexed via the detector circuits.

The BORAM organization lends itself to yield increases by the use of moderate size independent storage loops arranged in parallel as the basic memory chip. Furthermore, device operations, such as generation, annihilation, replication, and detection do not require independent circuitry for each device but instead may be accomplished as described. Moreover, BORAM organization permits wafer level integration of previously discrete bubble chips. Wafer level integration removes the necessity for discrete chips interconnection and, thus, greatly reduces the required number and complexity of leads in the bubble memory and associated electronics areas.

FIG. 3 depicts one possible embodiment of an improved block organization using the chip design described supra. The previously independent chip regions are fabricated side by side so as to form rows similar to the smaller rows of the basic chip. The guard-rail detectors for each of the rows are interconnected at the detector deposition level to form one detector, D, parallel to each row. Whether these detectors are comprised of one large detector unit or several smaller units is determined by detector signal optimization and mask fabrication considerations. The generator and replicate/annihilate loops are deposited as if the wafer contained only one device. All generator loops and all R/A loops in each row are connected in series by mask-level line fabrication. All of these lines can be terminated in a ground bus line, as shown in FIG. 3, to reduce the number of necessary interconnect leads.

The control leads, T, of the transfer switches for each of the loops are first fabricated as if a discrete chip were being fabricated. This is necessary to prevent the T leads from shorting the generate and R/A leads whenever the T leads are brought out to the wafer edge. The remaining standard chip fabrication steps are performed, including cutting the oxide to expose the bonding pads. Instead of bonding to the individual transfer lead pads, however, a final conductor pattern is fabricated connecting the corresponding transfer switches of each of the M rows, resulting in $T_Y$ transfer lines per wafer where Y is the number of separate loops in each row. Again, the number of leads is reduced by terminating each of the transfer lines into the common ground line of the chip. Clearly, some processing technique may be suitable for changing the order of the enumerated steps. However, the inventive concept includes these changes.

Thus, by adding only two additional simple processing steps (only one if contact printing is used) to those normally used in chip fabrication, wafer level integration is achieved. Moreover, the number of leads necessary to control the loops on the wafer is reduced to $Y+4M+1$ instead of $MP(N+R)$ for individual chip bonding using chips N loops wide where P is the number of individual chips in one row and M is the number of rows on one wafer. For example, assume that an array 8 loops wide and 5 rows deep were fabricated on a wafer. If the chip size is taken as half the wafer size, then wafer level integration reduces the number of leads from 65 to 29. Whenever several wafers are simultaneously connected so as to build a block access memory, using the parallel output capabilities to increase access times, the reduction in interconnect leads proves to be a highly desirable feature in making the block access approach feasible.

High yields and redundancy determine the value of wafer level integration techniques. The embodiment described in FIG. 3 readily lends itself to these two requirements. The individual loop sizes may be kept small enough that the yields for each of these are high. Since yield loss due to conductor failure is rare, wafer level yield is thus determined primarily by the yield of good columns connected by transfer lines. For a five loop column composed of 2048 bit loops whose individual yield values are 0.95 the expected yield factor for a good column is 77%. A yield factor of 75% should make wafer level integration competitive with discrete chip bonding. The chip area lost is compensated by the area saved due to the reduction in chip area needed for bonding pads, dicing lane area, elimination of chip yield degradation due to handling losses during bonding and dicing, plus the large savings in complexity and costs due to the greatly reduced number of bonds. Redundancy is readily demonstratable. Extra loops are fabricated in each row. Any column in which a loop is found to be bad during testing is removed from consideration by simply not bonding to the corresponding transfer line T. Good transfer lines are sequentially bonded to until the proper number is found to populate the block. Once the wafer has been cleared of bubbles the unbonded loops will not supply any spurious data to the detectors since the transfer replicate sequence need never occur for these loops.

Thus, there is shown and described a block oriented random access memory which provides increased throughput of information and reduced access or read out time for the same information. Alternative embodiments have been suggested as well as alternative operations of the respective embodiments. Those skilled in the art may note that other minor modifications to the invention may be achieved. For example, the type of propagation paths, the various operational devices and so forth may be formed of different configurations than those shown. However, the embodiments shown and described are intended to be illustrative only and not merely limitative. Any modifications that fall within the purview of this description are intended to be included herein.

Having thus described a preferred embodiment of the invention, what is claimed is:

1. In combination,
   at least one storage loop,
   generator means for producing data,
   transfer means interposed between said storage loop and said generator means for selectively transferring data from said generator means to a first location in said storage loop in response to a first signal,
   merging means,
   propagation path means connected to said generator means and to said merging means which forms a second location in said storage loop,
   said transfer means selectively transferring data from said first location in said storage loop to said propagation path means in response to a second signal,
   detector means, and
   replicate means for selectively nondestructively transferring data from said propagation path means to said detector means.

2. The combination recited in claim 1 wherein said transfer means comprises a device having the configuration of a dollar sign ($).

3. The combination recited in claim 1 including
   wafer means for supporting a plurality of said storage loops and the associated elements recited in claim 1, and
   connection means for selectively connecting predetermined ones of said storage loops into an operational array.

4. The combination recited in claim 1 wherein
   the portion of said storage loop between said first and second locations therein is substantially similar in length to said propagation path means.

5. The combination recited in claim 1 including
   further propagation path means for propagating data from said generator to said transfer means and to said propagation path means.

6. The combination recited in claim 1 including
   another propagation path mens for propagating data from said replicate means to said detector means.

7. The combination recited in claim 1 wherein
   said transfer means is operable to transfer data therethrough in only one direction at a time.

8. The combination recited in claim 1 wherein said generator means and said replicate means each comprises a current loop associated with propagation devices.

9. The combination recited in claim 1 wherein said detector means comprises a stretcher detector.

10. The combination recited in claim 1 wherein said data is in the form of magnetic bubble domains.

11. The combination recited in claim 1 wherein said propagation path means is arranged in parallel with,
said portion of said storage loop extending between said first and second locations in said storage loop.

12. The combination recited in claim 11 wherein at least one portion of said storage loop comprises a plurality of interconnected transition devices forming a preferred turn-off device arrangement.

13. The combination recited in claim 1 including annihilator means for selectively destroying data in said propagation path means.

14. The combination recited in claim 13 wherein said annihilator means and said replicate means include a common current conductor loop disposed adjacent separate propagation channels,
said propagation path means comprising at least one of said propagation channels, said
means connecting said replicate means to said detector means comprising a further propagation channel.

15. The combination recited in claim 13 including signal supplying means for supplying control signals to said generator means, said transfer means, said replicate means and said annihilator means.

16. The combination recited in claim 15 wherein said replicate means and said annihilator means comprise an integral device connected to receive signals from said signal supplying means to control the operation thereof.

17. A block organized random access memory system including
detector means, and
a plurality of chip organizations each comprising storage loop means,
generator means,
propagation path means connected to said storage loop means,
transfer means arranged to selectively transfer information from said generator means to one of said propagation path means and said storage loop means and from said storage means to said propagation path means,
replicate means for selectively replicating information from said propagation path means to said detector means, and
annihilate means for selectively destroying information in said propagation path means.

18. The memory system recited in claim 17 including signal source means for supplying signals to said generator means, said transfer means, said replicate means and said annihilate means to selectively activate at least one of the enumerated means to produce the desired function thereof.

19. The memory system recited in claim 17 wherein said detector means comprises a plurality of separate detector elements connected to different storage loop means to receive information therefrom.

20. The block organize random access memory system recited in claim 17 wherein said transfer means comprises a two-way transfer switch device for selectively transferring information in either direction therethrough.

* * * * *